United States Patent [19]

Itano et al.

[11] Patent Number: 5,105,388

[45] Date of Patent: Apr. 14, 1992

[54] PROGRAMMABLE LOGIC DEVICE INCLUDING VERIFY CIRCUIT FOR MACRO-CELL

[75] Inventors: Kiyoshi Itano; Kohji Shimbayashi, both of Kawasaki, Japan

[73] Assignee: Fujitsu Limited, Kawasaki, Japan

[21] Appl. No.: 632,652

[22] Filed: Dec. 26, 1990

Related U.S. Application Data

[63] Continuation of Ser. No. 243,264, Sep. 12, 1988, abandoned.

[30] Foreign Application Priority Data

Sep. 18, 1987 [JP] Japan ................................ 62-235870

[51] Int. Cl.$^5$ .................. G11C 16/06; H03K 19/0944
[52] U.S. Cl. ................................ 365/189.08; 365/185; 365/189.07; 365/63; 307/465; 307/468; 340/825.87; 340/825.91
[58] Field of Search ................... 365/189.08, 104, 184, 365/185, 189.07, 201, 226, 63; 364/716; 307/465, 468; 340/825.83, 825.87, 825.91

[56] References Cited

U.S. PATENT DOCUMENTS

| | | | |
|---|---|---|---|
| 4,041,459 | 8/1977 | Horninger | 340/825.87 |
| 4,578,771 | 3/1986 | O'Hara, Jr. | 364/716 |
| 4,609,986 | 9/1986 | Hartmann et al. | 364/716 |
| 4,611,126 | 9/1986 | Miller | 307/64 |
| 4,713,792 | 12/1987 | Hartmann et al. | 364/900 |
| 4,745,579 | 5/1988 | Mead et al. | 307/465 |
| 4,763,020 | 8/1988 | Takata et al. | 307/465 |
| 4,771,285 | 9/1988 | Agrawal et al. | 307/465 |
| 4,783,606 | 11/1988 | Goetting | 307/465 |
| 4,815,036 | 3/1989 | Kyomasu | 365/185 |
| 4,857,773 | 8/1989 | Takata et al. | 307/468 |

FOREIGN PATENT DOCUMENTS 0281215 9/1988 European Pat. Off. ............ 307/465

Primary Examiner—Glenn Gossage
Attorney, Agent, or Firm—Staas & Halsey

[57] ABSTRACT

A programmable logic device includes an input/output buffer, a logic array, switches for switching signal lines provided between the logic array and the input/output buffer and feedback lines between an input and an output of the logic array so as to alter the logic operation. Switching operations of the switches such as an open/close operation and a selection operation, are determined by the data stored in a plurality of non-volatile memory elements arranged in a matrix of rows and columns, the non-volatile memory elements being respectively associated with the switches. The contents of the memory elements are read out and stored in registers. The data contents of the non-volatile memory elements as thus stored in the registers are applied to control terminals of the switches.

11 Claims, 14 Drawing Sheets

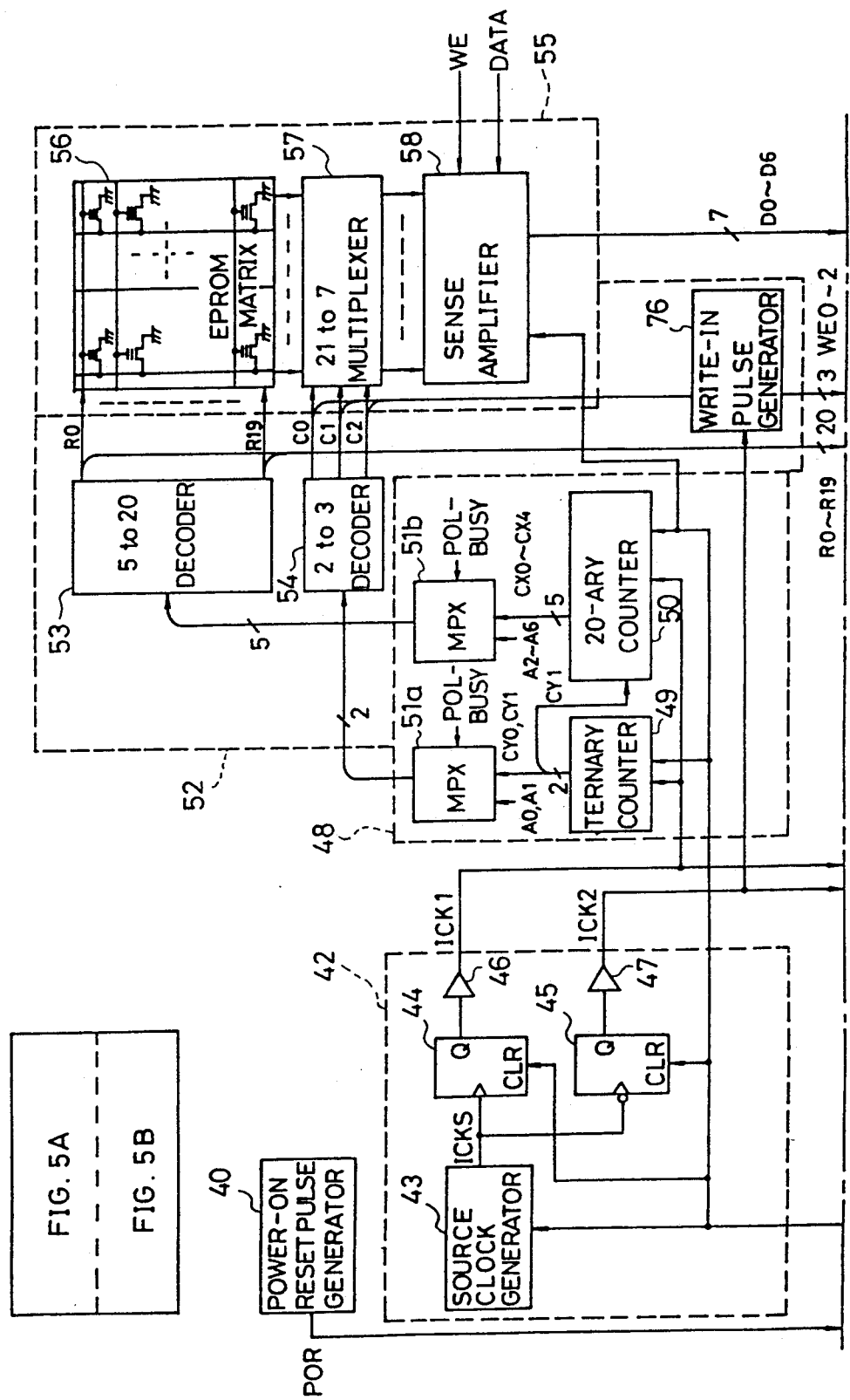

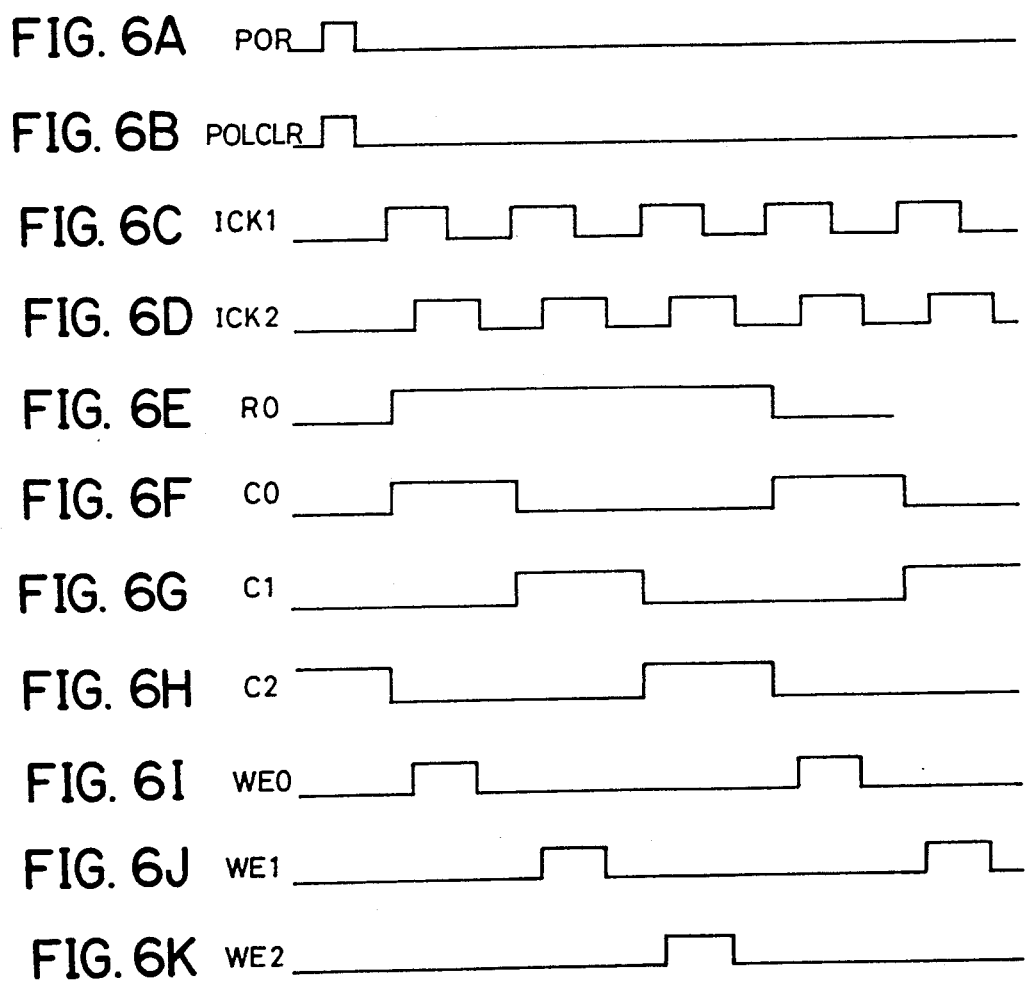

FIG. 7A
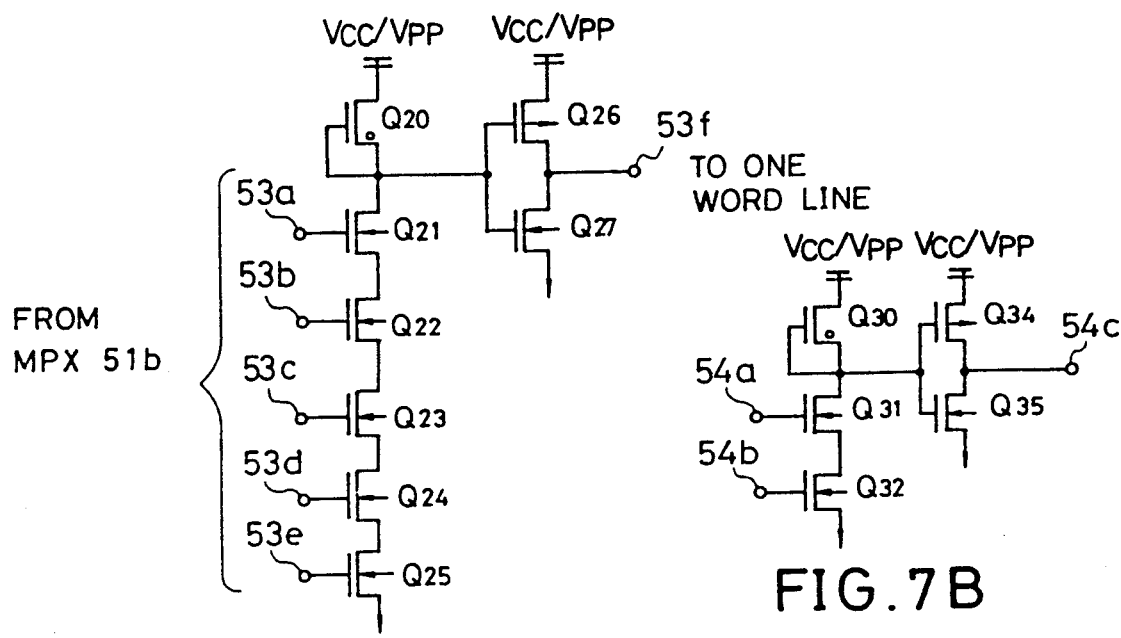
FIG. 7B
FIG. 8
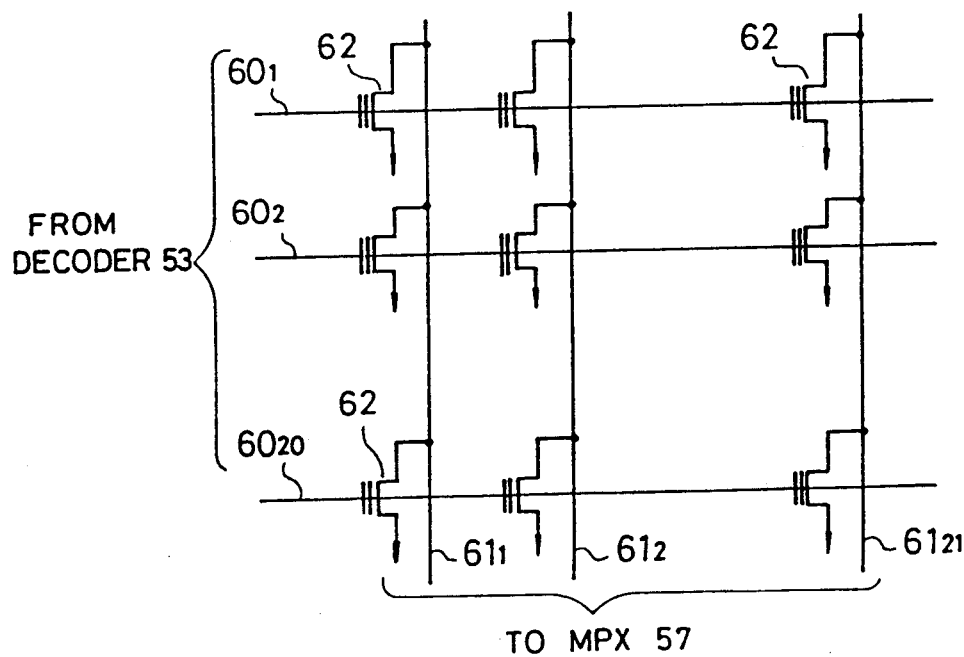

PROGRAMMABLE LOGIC DEVICE INCLUDING VERIFY CIRCUIT FOR MACRO-CELL

This application is a continuation of application Ser. No. 07/243,264, filed Sept. 12, 1988, now abandoned.

BACKGROUND OF THE INVENTION

The present invention generally relates to a programmable logic device and in particular to a programmable logic device which includes a verify circuit for a macro-cell and signal control in accordance with storage contents of programmable non-volatile memory elements.

A programmable logic array such as a programmable logic array device (hereafter simply referred to PLA device) or a programmable array logic (PAL device) has switches and programmable non-volatile memory elements such as erasable and programmable read only memory cells (hereafter simply referred to as EPROM cells). Switches are used for opening and closing corresponding signal lines or for selecting specific, individual signals therefrom. Each of the switches is controlled in accordance with information storage content of the corresponding programmable non-volatile memory element. The associated programmable non-volatile memory elements and the switches comprise a control circuit block which establishes and alters logic connections such as a signal input/output connection and an internal feedback connection. Such a control circuit block is hereafter referred to as a macro-cell. In general, the programmable logic array device includes a plurality of macro-cells.

Conventionally, for each of the non-volatile memory elements, there is provided a set of a write-in circuit, a read-out circuit and a power source switching circuit which is used for selectively supplying the write-in and read-out circuits with a power source voltage. In general, these circuits are made up of metal oxide semiconductor transistors (hereafter simply referred to as MOS transistors). In particular, the write-in circuit and the power source switching circuit must be constructed by MOS transistors having a high-voltage resistant ability, high-voltage standoff, or withstand, characteristic.

The conventional programmable logic device including the above macro-cell has the following disadvantages. First, in order for the programmable logic device to have an increased number of switches to thereby enhance functions thereof, a semiconductor chip having a greatly increased surface area must be used. This is because the write-in circuit, read-out circuit and power source switching circuit must be provided for each non-volatile memory element, and particularly the write-in circuit and the power source switching circuit are constructed by high-voltage resistant MOS transistors. Secondly, a test to check whether or not the write-in circuit and read-out circuit operate correctly, must be carried out for each of the non-volatile, memory elements. Therefore, a long time is required to test the device.

SUMMARY OF THE INVENTION

Accordingly, a general object of the present invention is to provide a novel and useful programmable logic device in which the above disadvantages are eliminated.

A more specific object of the present invention is to provide a programmable logic device which has a considerably increased number of switches without using an increased size of a semiconductor chip to thereby provide expanded functions of the device.

Another object of the present invention is to provide a programmable logic device in which the time required to test the programmable logic device can be shortened.

The above objects of the present invention are achieved by a programmable logic device including the following structural elements An input/output buffer passes an input signal and an output signal a signal to be supplied respectively, thereto from and thereby to, an external circuit. A logic array performs a logic operation for a signal applied thereto. A switching circuit (macro-cell) includes switches for switching signal lines provided between the logic array and the input/output buffer and feedback lines between an input and output of the logic array so as to alter the logic operation. An EPROM matrix includes a plurality of non-volatile memory elements arranged in a matrix of rows and columns which are provided for the respective switches. The memory content of, i.e., the information stored in each of the non-volatile memory elements is used for controlling the switching operation of the corresponding switch. A read-out circuit reads out the contents of the non-volatile memory elements. A register circuit stores the contents of the non-volatile memory elements which are read out by the read-out circuit. The switching operations of the switches are controlled by the contents of the non-volatile memory elements stored in the register circuit.

Other objects, features and advantages of the present invention will become apparent from the following detailed description when read in conjunction with the accompanying drawings

BRIEF DESCRIPTION OF THE DRAWINGS

FIG. 5 is a view showing how to combine FIGS. 5A and 5B;

FIGS. 5A and 5B are block diagrams of a power-on load circuit shown in FIG. 4;

FIGS. 6(A) through 6(k) show signal waveforms at different portions in the arrangement of FIGS. 5A and 5B;

FIG. 7A is a circuit diagram of a 5-to-20 decoder 53 shown in FIG. 5A;

FIG. 7B is a circuit diagram of a 2-to-3 decoder 54 shown in FIG. 5A;

FIG. 8 is a circuit diagram of an EPROM matrix 56 shown in FIG. 5A;

DETAILED DESCRIPTION

To facilitate the understanding of the present invention, a description is given of a conventional programmable logic device with reference to FIGS. 1A and 1B, 2A and 2B, and 3.

Figure 1A:
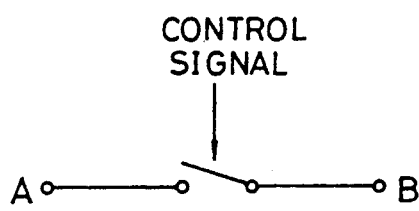
FIGS. 1A and 1B respectively show the symbol for, and the circuit of, a switch which may be constructed in a macro-cell.
Figure 1B:
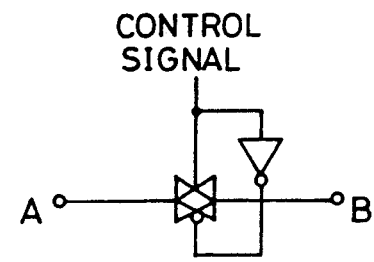
Figure 2A:
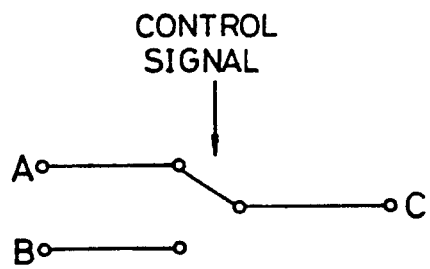
FIGS. 2A and 2B respectively show the symbol for, and the circuit of, another switch which may be constructed in the macro-cell.
Figure 2B:
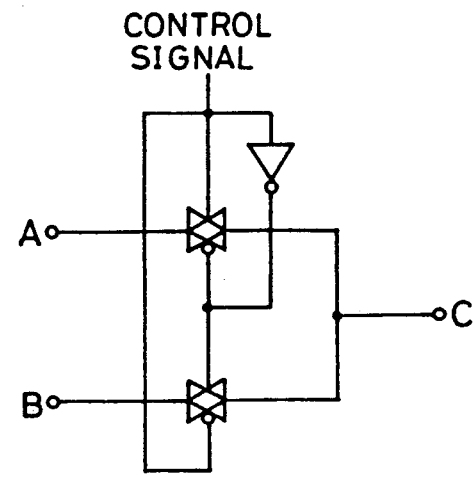

In general, a macro-cell contains switches such as a switch, shown respectively by a symbol and a circuit in FIGS. 1A and 1B for opening or closing a signal line A-B, and a switch, shown in like fashion in FIGS. 2A and 2B, for selectively switching between and thereby establishing one of two signal lines A-C and B-C. The conventional macro-cell has a programmable non-volatile memory element such as an EPROM cell provided for each of the switches. The non-volatile memory elements are used for controlling the respectively associated switches. Each of the switches is connected to corresponding write-in, read-out, and power source switching circuits as shown in FIG. 3.

Figure 3:
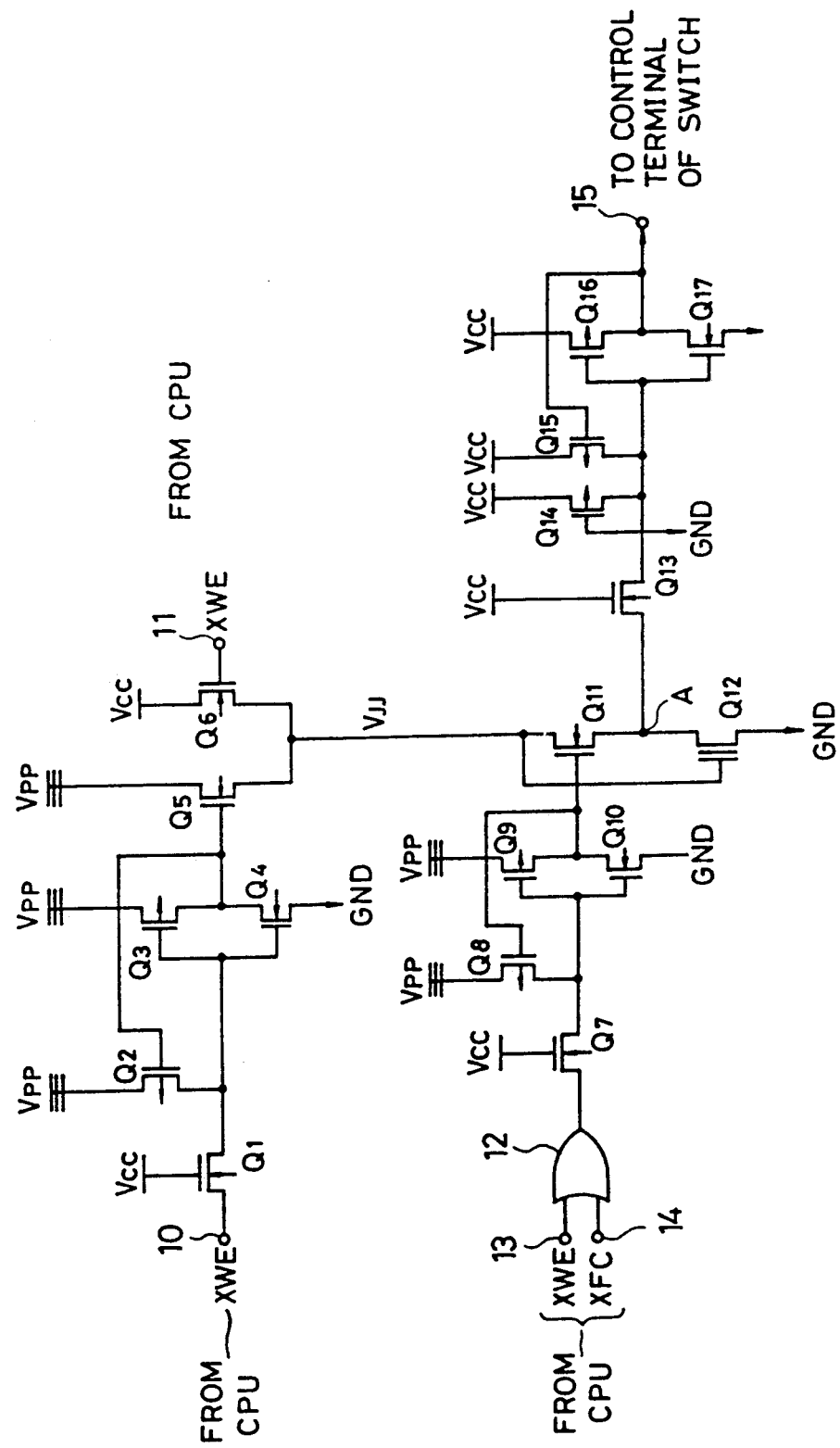
FIG. 3 is a circuit diagram of write-in, read-out and power source switching circuits which are provided for each of the non-volatile memory elements for controlling corresponding switches contained in a conventional programmable logic device.

In FIG. 3, a MOS transistor Q12 which is an EPROM cell, serves as a programmable non-volatile memory element. MOS transistors Q1 to Q6 construct a power source switching circuit. A write-in circuit is made up of MOS transistors Q7 to Q11 and an OR circuit 12. A read-out circuit is made up of MOS transistors Q13 through Q17. When a write enable signal XWE supplied to terminals 10 and 11 from a central processing unit (not shown: hereafter simply referred to as CPU), for example, is kept at a low level, the MOS transistor Q5 is allowed to conduct. Then, the memory element Q12 can be supplied with a write-in power source voltage Vpp (12 volts, for example). On the other hand, when the write enable signal XWE is kept at a high level, the MOS transistor Q6 is allowed to conduct, so that the MOS transistor Q12 can be provided with a normal power source voltage Vcc (5 volts, for example). When both the write enable signal XWE and a fuse cut signal XFC which are applied to terminals 13 and 14, respectively, are kept at the low level, the MOS transistor Q11 is allowed to conduct, so that the write-in power source voltage Vpp can be supplied to the EPROM cell Q12. Thereby, an excessive current is allowed to flow through the EPROM cell Q12, and a datum can be written therein. After the datum is written into the EPROM cell Q12, the source and drain thereof are kept electrically disconnected. In this state, the potential at a point A is kept high due to the function of the MOS transistor Q14, and therefore the potential at a terminal 15 is kept low. On the other hand, when the datum has not been written into the EPROM cell Q12, or in other words the EPROM cell Q12 is kept in conduction, the potential at the point A is kept low, and therefore the potential at the terminal 15 is kept high. A change of the potential at the terminal 15 is supplied, as a control signal, to a control terminal of a corresponding switch (not shown in FIG. 2).

However, the above conventional programmable logic device has the aforementioned disadvantages. The present invention intends to overcome the disadvantages. A description is given of a preferred embodiment of the present invention.

Figure 4:
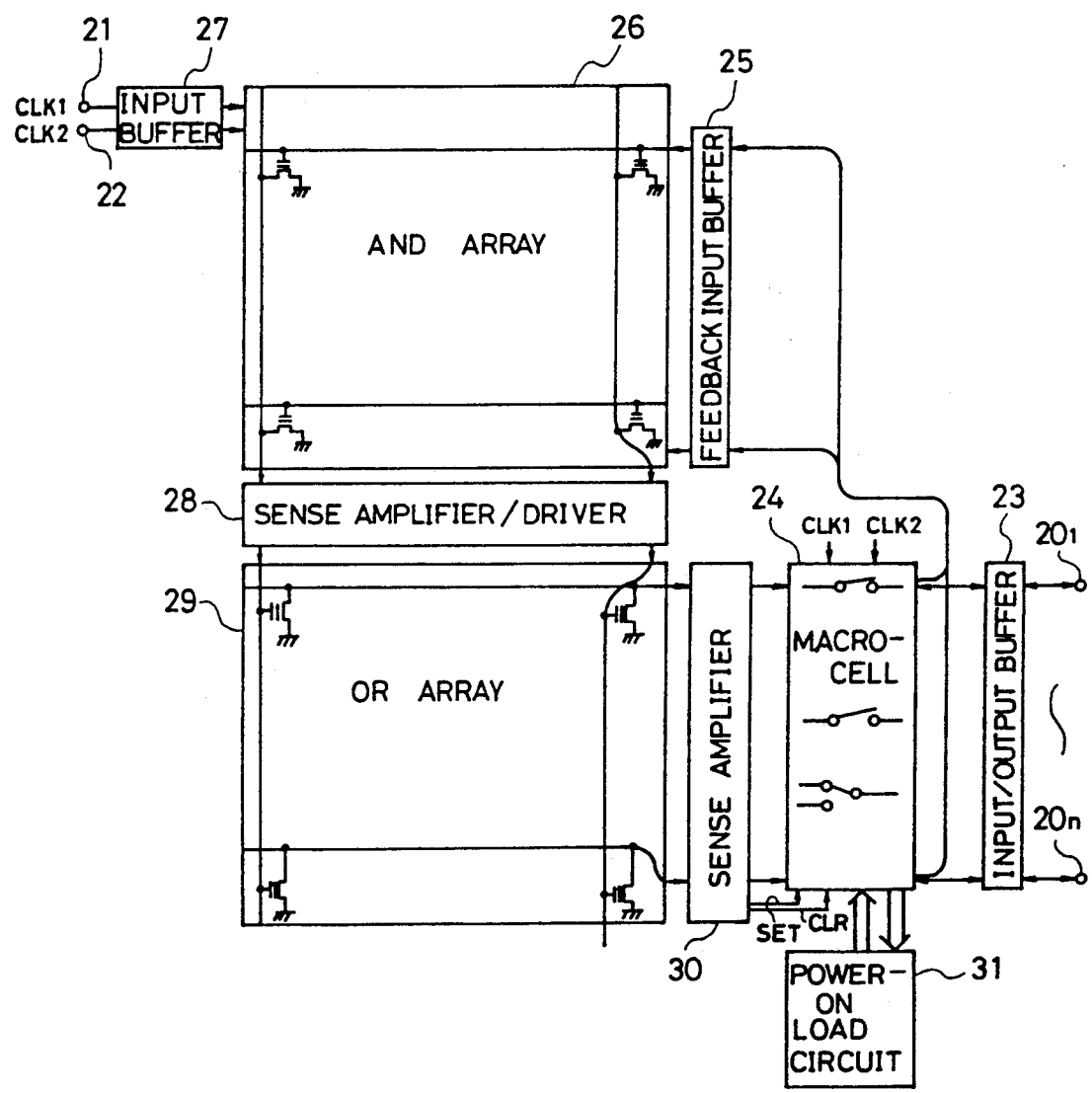
FIG. 4 is a block diagram of a preferred embodiment of the present invention.

Referring to FIG. 4, signals applied to input/output terminals $20_1$ to $20_n$ (external input signals) are supplied from an external circuit such as a CPU (not shown) to a macro-cell 24 through an input/output buffer 23. Signals supplied from the macro-cell 24 are supplied to an AND array 26 through a feedback input buffer 25. The signal from the macro-cell 24 is the signal from the input/output buffer 23 or a signal supplied from an OR array 29 through a sense amplifier 30 (a feedback signal). The AND array 26 is also supplied with clock signals CLK1 and CLK2 which are applied to terminals 21 and 22, respectively and which pass through an input buffer 27. Output signals of the AND array 26 are supplied through product term lines to a sense amplifier/driver 28, which amplifies the output signals of the AND array 26. Amplified output signals are supplied to the OR array 29.

Output signals of the OR array 29 are supplied to the macro-cell 24 through the sense amplifier 30, at which the output signals of the OR array 29 are separated into feedback signals and external output signals. The external output signals are supplied to the external circuit through the input/output buffer 23 and input/output terminals $20_1$ through $20_n$. The macro-cell 24 is supplied with the clock signals CLK1 and CLK2 supplied through the input buffer 27 and supplied with a set signal SET and a clear signal CLR which are supplied from the sense amplifier 30. The macro-cell 24 contains switches as shown in FIGS. 14A through 14D as well as a write-in and read-out circuit shown in FIGS. 11A and 11B which are used in common to all the switches contained in the macro-cell 24.

A power-on load circuit 31 includes non-volatile memory elements which are arranged in a matrix of rows and columns. The non-volatile memory elements are associated with the respective switches of the macro-cell 24. That is, each of the switches of the macro-cell 24 is controlled by the corresponding non-volatile memory element. As described in detail later, at the time of turning power ON, the states of the non-volatile memory elements are read out and are then loaded into registers provided in the write-in circuit of the macro-cell 24. The contents of the registers are supplied to the switches, so that states of the switches can be controlled.

Figure 5B:
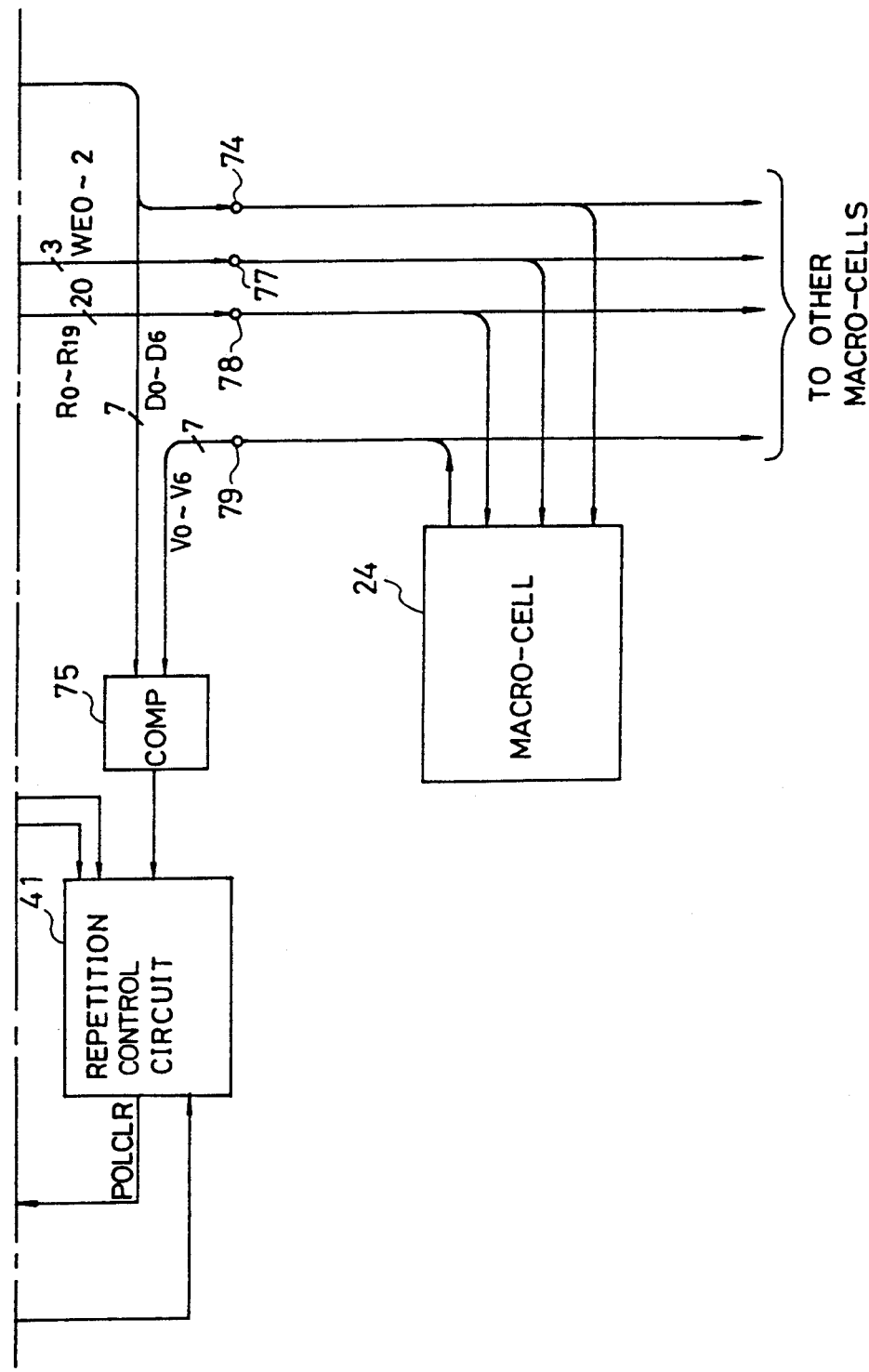

FIGS. 5A and 5B are block diagrams showing a structure of the power-on load circuit 31. Referring to FIGS. 5A and 5B, a power-on reset pulse generator 40 generates a detection signal POR as shown in FIG. 6(A) when detecting power ON. The detection signal POR is supplied to a repetition control circuit 41. The repetition control circuit 41 generates a control signal POLCLR as shown in FIG. 6(B) in response to the application of the detection signal POR. The control signal POLCLR is supplied to a source clock generator 43 provided in a clock generator 42.

The source clock generator 43 repetitively generates source clock signal ICKS when the control signal POLCLR is kept at the low level, and supplies a T-type flip-flops 44 and 45 with the source clock signal ICKS. The flip-flop 44 is cleared by a rising edge of the control signal POLCLR, and is thereafter triggered by a rising edge of the source clock signal ICKS. When triggered, the flip-flop 44 generates a clock signal ICK1 shown in FIG. 6(C). The clock signal ICK1 is supplied to an address generator 48 through a buffer 46. The flip-flop 45 is cleared by the rising edge of the control signal POLCLR, and is thereafter triggered by a trailing edge of the source clock signal ICKS. When triggered, the flip-flop 45 generates a clock signal ICK2 shown in FIG. 6(D) which lags behind the clock signal ICK1 by 90°. The clock signal ICK2 is then supplied to the repetition control circuit 41 and an access control circuit 52 through a buffer 47. The clock signal ICK1 is used for defining the timing for reading out the contents of an EPROM matrix 56 provided in a non-volatile memory matrix part 55, and the clock signal ICK2 is used for defining the timing of for writing the read-out contents of the EPROM matrix 56 into the registers provided in the macro-cell 24.

A ternary counter 49 provided in the address generator 48 is cleared by the rising edge of the control signal POLCLR, and then increments in synchronism with the rise of the clock signal ICK1. The ternary counter 49 produces addresses consisting of two bits CY0 and CY1. A 20-ary counter 50, which receives the address signal CY1 at a carry-in terminal thereof, is cleared by the control signal POLCLR. Thereafter only when the counted value of the ternary counter 49 becomes equal to "2", the 20-ary counter 50 counts up in synchronism with the rise of the clock signal ICK1, and produces addresses consisting of 5 bits CX0 to CX4. The address signals CY0 and CY1 are supplied to a multiplexer ("MPX") 51a, and the address signals CX0 to CX4 are supplied to a multiplexer ("MPX") 51b. The multiplexer 51a is also supplied with write-in address signals A0 and A1 from the CPU (not shown), and the multiplexer 51b is also supplied with write-in address signals A2 to A6. The selected address signals from the multiplexers 51b and 51a are supplied to a 5-to-20 decoder 53 and a 2-to-3 decoder 54, respectively, both of which are contained in the access control circuit 52. The multiplexers 51a and 51b select the address signals supplied from the counters 49 and 50, respectively, when a switching signal POLBUSY (described later) is kept at the low level. Then data can be written into the EPROM matrix 56 through a sense amplifier and a 21-to-7 multiplexer 57. On the other hand, when the switching signal POLBUSY is kept at the high level, the contents can be read out from the EPROM matrix 56.

The 5-to-20 decoder 53 contains 20 circuits, each of which is shown in FIG. 7A. Referring to FIG. 7A, a depletion type MOS transistor Q20 functions as a load resistor. Gates of n-channel MOS transistors Q21 to Q25 connected as shown are supplied with the address signals CX0 to CX4 or inverted address signals thereof through terminals 53a to 53e, respectively. A drain output of the MOS transistor Q21 is delivered to an output terminal 53f through an inverter which is made up of MOS transistors Q26 and Q27. The output terminal 53f in each of the 20 circuits is connected to a corresponding word line of the EPROM matrix 56. That is, 20 word line selecting signals R0 to R19 derived from the 5-to-20 decoder 53 are supplied to the corresponding word lines of the EPROM matrix 56. The word line selecting signals R0 to R19 sequentially select one of the 20 word lines of the EPROM matrix 56. The word line selecting signal R0 in FIG. 6(E).

The 2-to-3 decoder 54 contains 3 circuits, each of which is shown in FIG. 7B. Referring to FIG. 7B, a depletion type MOS transistor Q30 functions as a load resistor. Gates of MOS transistors Q31 and Q32 are supplied with the address signals CY0 and CY1 or inverted address signals thereof. A drain output of a MOS transistor Q31 is supplied to an output terminal 54c through an inverter which is composed of MOS transistors Q34 and Q35. In this manner, the decoder 54 generates column gate signals C0 to C2 as shown in FIGS. 6(F) through 6(H). The column gate signals C0 to C2 are supplied to the 21-to-7 multiplexer 57 provided in the non-volatile memory cell matrix part 55.

As shown in FIG. 5A, the non-volatile memory cell matrix part 55 is made up of the EPROM matrix 56, the multiplexer 57 and the sense amplifier 58. As shown in FIG. 8, the EPROM matrix 56 includes 20 word lines $60_1$ to $60_{20}$, 21 bit lines $61_1$ to $61_{21}$, and 20×21 number of EPROM cells 62 which are provided at intersecting points of the word lines $60_1$ to $60_{20}$ and bit lines $61_1$ to $61_{21}$. The word lines $60_1$ to $60_{20}$ are connected to the decoder 53, and the bit lines $61_1$ to $61_{21}$ are connected to the multiplexer 57.

In the multiplexer 57, the 21 bit lines are divided into 7 blocks each consisting of 3 bit lines. The multiplexer 57 selects the first bit line of each of the 7 blocks when the column gate signal C0 is supplied thereto. The multiplexer 57 selects the second bit line of each block when the column gate signal C1 is supplied thereto. When the column gate signal C2 is supplied to the multiplexer 57, it selects the third bit line of each block.

Figure 9:
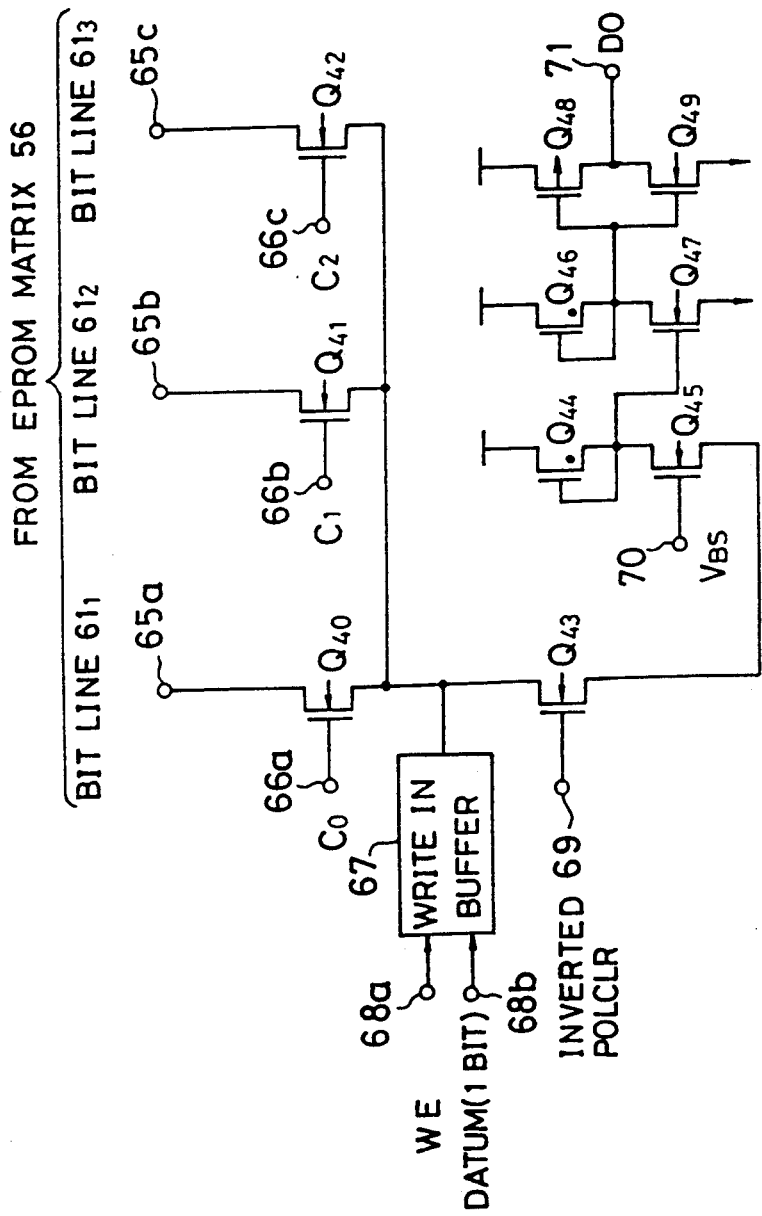
FIG. 9 is a circuit diagram of a multiplexer 57 and a sense amplifier 58 shown in FIG. 5A.

FIG. 9 shows a basic part of the multiplexer 57 and the sense amplifier 58. Referring to FIG. 9, terminals 65a to 65c are connected to the bit lines $61_1$ to $61_3$, respectively. The column gate signals C0 to C2 are supplied, through terminals 66a to 66c, to the gates of MOS transistors. Q40 to Q42, respectively, which together comprise the multiplexer 57. Sources of the MOS transistors Q40 to Q42 are connected in common to a write-in buffer 67 and the drain of a MOS transistor Q43. The write-in buffer 67 is supplied through terminals 68a and 68b with the write enable signal WE and a one-bit write-in datum, respectively, which may be supplied from the CPU, for example. The write-in buffer 67 is activated only when the datum is written into one of the EPROM cells 62 provided in the EPROM matrix 56. The one-bit write-in datum is supplied to one of the bit lines $61_1$ to $61_3$ which is selected by the column gate signals C0 to C2. The MOS transistor Q43 is supplied, through a terminal 69, with the inverted signal of the control signal POLCLR. The MOS transitransistor Q43 is allowed to conduct only at the time of the power-on loading operation. A MOS transistor Q45 is supplied, through a terminal 70, with a bias voltage $V_{BS}$ (approximately 2 volts). MOS transistors Q44 and Q46 are of the depletion type, and function as load resistors.

A signal that passes through the MOS transistor Q43 passes through the MOS transistors Q45 and 47, Q47 functioning along with Q46 as a first, resistance-load type inverter, and through a second, CMOS-type inverter comprising MOS transistors Q48 and Q49, the output of the second inverter being applied, as a read-out datum D0, to a terminal 71.

The multiplexer 57 and the sense amplifier 58 are constructed by 7 circuirs, each of which is illustrated in FIG. 9. The read-out signal consisting of 7 bits D0 to D6 derived from the multiplexer 57 are supplied, through the sense amplifier 58, to a comparator 75 shown in FIG. 5B and also to the macro-cell 24 through a terminal 74.

Figure 10:
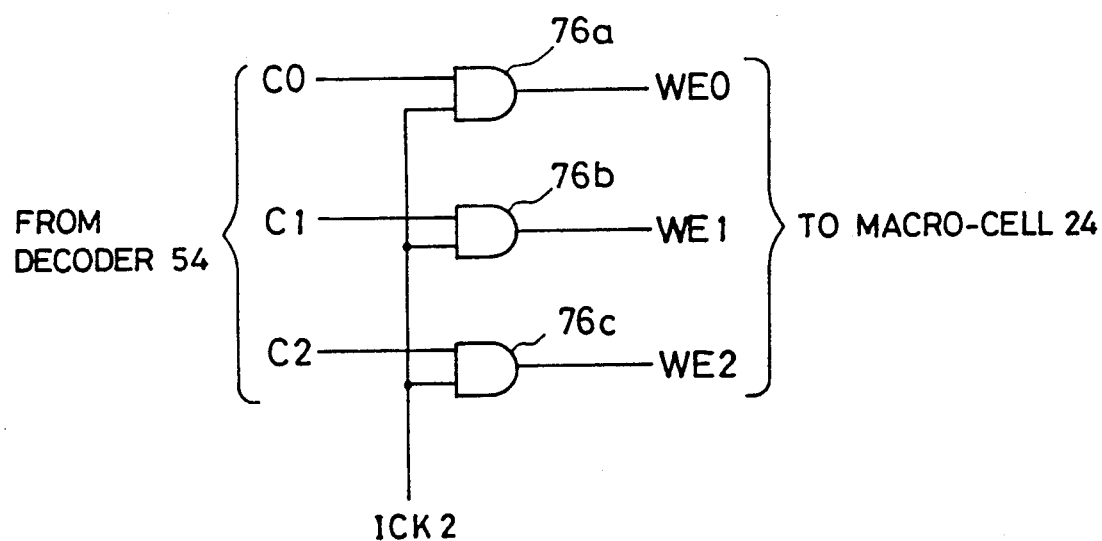
FIG. 10 is a circuit diagram of a write-in pulse generator 76 shown in FIG. 5A.

The write-in pulse generator 76 is constructed by 3 AND gates 76a to 76c, as shown in FIG. 10. The AND GATES 76a to 76c are supplied with the column gate signals C0 to C2 from the decoder 54, respectively, and also with the clock signal ICK2 supplied from the buffer 47. The write-in pulse generator 76 generates a write-in pulse signal consisting of 3 bits WE0 to WE2 as shown in FIG. 6(I) through 6(K), which are fed to the macro-cell 24 through a terminal 77. The word line selecting signals R0 to R19 are supplied to the macro-cell 24 via a terminal 78.

Figure 11:
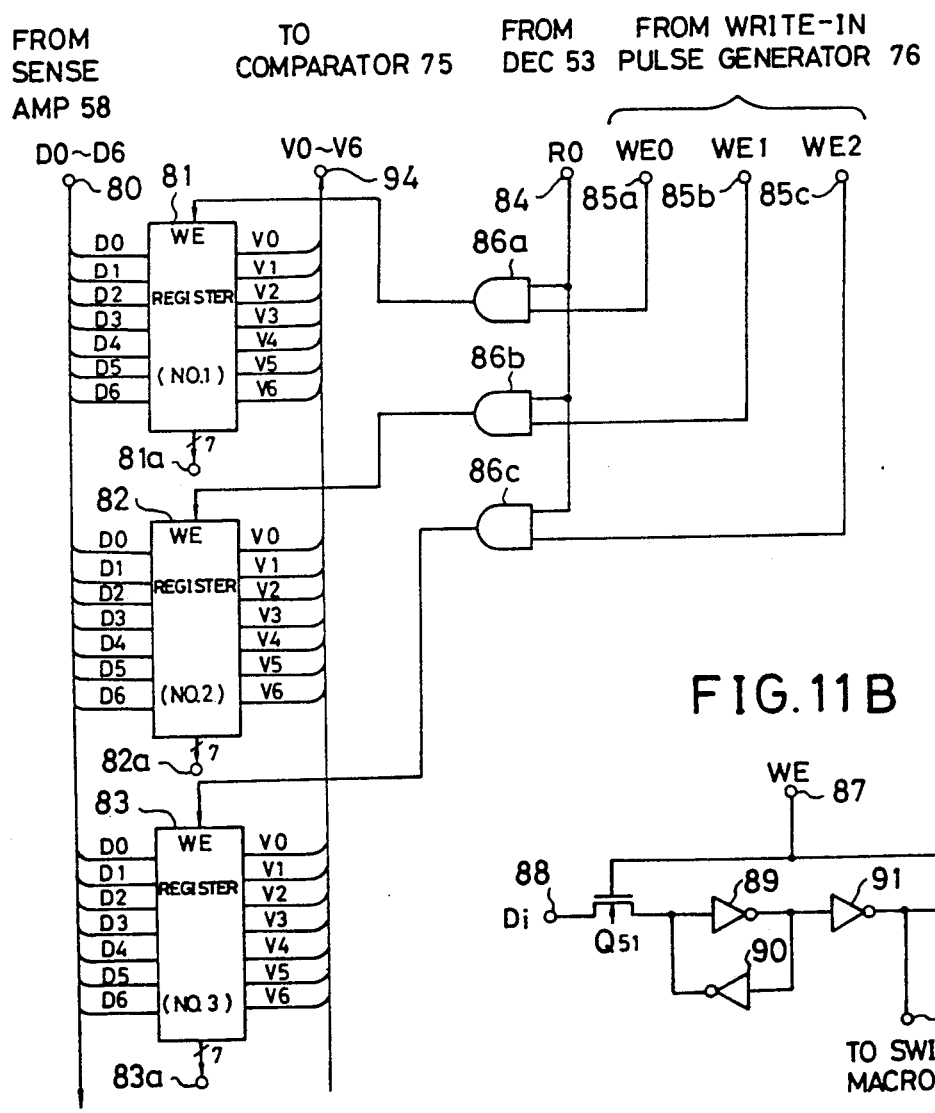
FIG. 11A is a circuit diagram of a macro-cell 24 shown in FIG. 4.
FIG. 11B is a circuit diagram of a part of each of the registers 81 to 83 shown in FIG. 11A.

FIG. 11A shows a basic part of a write-in and read-out circuit constructed in the macro-cell 24. Referring to FIG. 11A, the read-out signals D0 to D6 are supplied to registers 81 to 83 through a terminal 80 which is connected to the terminal 74 shown in FIG. 5B. AND circuits 86a to 86c are supplied with the word selecting signal R0 applied to a terminal 84 connected to the terminal 78, and are supplied with the write-in pulse signals WE0 to WE2 applied to terminals 85a to 85c, respectively, which are connected to the terminal 77. The AND circuits 86a to 86c generate write enable signals, each designated WE, applied to the respective WE inputs of the registers 81 to 83, respectively.

A circuit portion which is formed in each of the registers 81 to 83 and which is provided for each of the bits D0 to D6, is constructed as shown in FIG. 11B. Referring to FIG. 11B, MOS transistors Q51 and Q52 are allowed to conduct when the write enable signal WE is applied to a terminal 87 which corresponds to one of the terminals 81 to 83. When the MOS transistors Q51 and Q52 are held in conduction, the one-bit datum Di passing through a terminal 88 is latched by a latch circuit composed of inverters 89 to 91. A latched one-bit datum is always supplied through a terminal 93 to the corresponding switch formed in the macro-cell 24.

The latched datum Di obtained at the terminal 93, for each of the bits D0 to D6 in each of the registers 81 to 83, is supplied as a control signal to the corresponding switch formed in the macro-cell 24. The datum Vi obtained at a terminal 92, provided for each of the bits D0 to D6, is supplied as a verify datum to the comparator 75 through the terminal 79 shown in FIG. 5B. The macro-cell 24 contains 20 circuits, one of which is shown in FIG. 11B.

Figure 12:
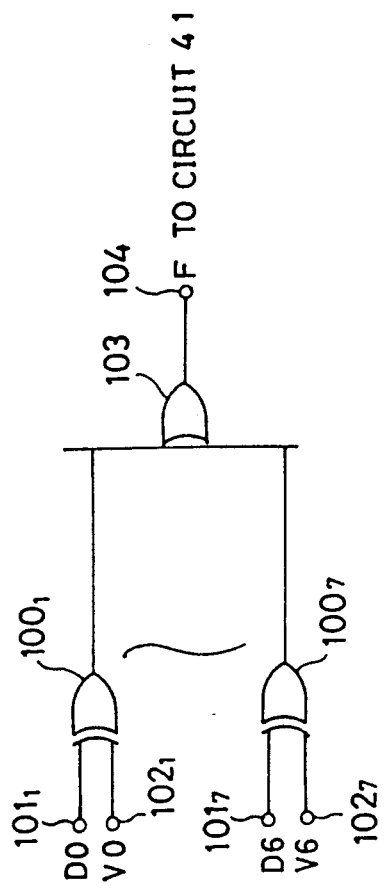
FIG. 12 is a circuit diagram of a comparator 75 shown in FIG. 5B.

The comparator 75 has a circuit configuration shown in FIG. 12. Exclusive-OR circuits $100_1$ to $100_7$ compare the read-out data D0 to D6 applied to terminals $101_1$ to $101_7$ with the verify data V0 to V6 applied to terminals $102_1$ to $102_7$, respectively. Outputs of the exclusive-OR circuits $100_1$ to $100_7$ are supplied to an OR circuit 103. The OR circuit 103 produces a verify fail signal F held ar the high level in the cases other than a case when the read-out data D0 to D7 completely coincide with the verify data V0 to V7, respectively. The verify fail signal F is supplied to the repetition control circuit 41 shown in FIG. 5B through a terminal 104.

Figure 13:
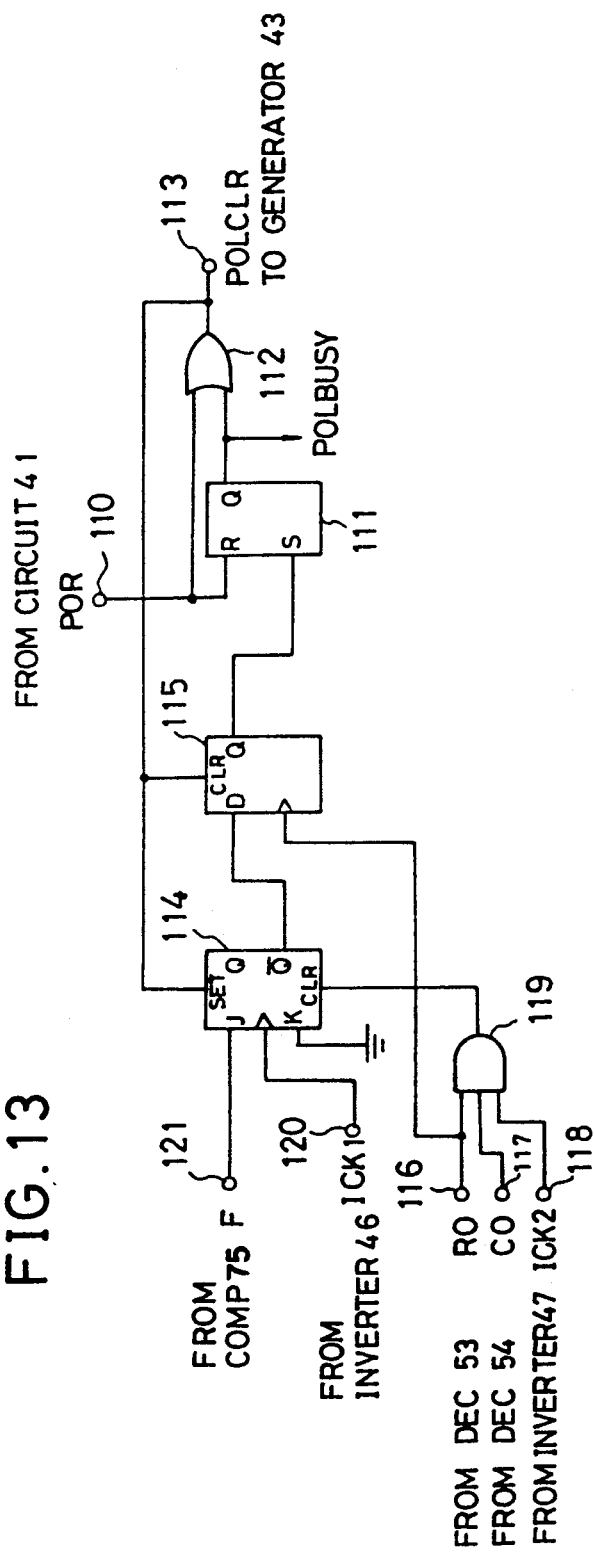
FIG. 13 is a circuit diagram of a repetition control circuit 41 shown in FIG. 5B.

The repetition control circuit 41 is constructed as shown in FIG. 13. Referring to FIG. 13, a RS type flip-flop 111 is reset by the detection signal POR supplied from the power-on reset generator 40 through a terminal 110. An output signal POLBUSY of the flip-flop 111 is supplied to an OR circuit 112 and also to the multiplexers 51a and 51b shown in FIG. 5A. When the signal POLBUSY is kept at the low level, the multiplexers 51a and 51b select the address signals derived from the counters 49 and 50, respectively. The OR circuit 112 produces the control signal POLCLR. The control signal POLCLR is supplied through a terminal 113 to the source clock generator 43, the flip-flops 44 and 45, the counters 49 and 50, and the sense amplifier 58 shown in FIG. 5A. Additionally, the control signal POLCLR sets a JK-type flip-flop 114, and clears a D-type flip-flop 115.

After reset, the flip-flop 114 is cleared by an output of an AND circuit 119, which performs an AND operation for the word selecting signal R0, the column gate signal C0 and the clock signal ICK2. After that, the flip-flop 114 is set in synchronism with the clock signal ICK1 supplied through a terminal 120 when the verify fail signal F supplied from the comparator 75 through a terminal 121 is kept at the low level. When the verify fail signal F is changed over to the high level, a $\bar{q}$-terminal output of the flip-flop 114 is switched to the low level and is supplied to a D-terminal of the flip-flop 115.

The flip-flop 115 latches the $\bar{Q}$-terminal output of the flip-flop 114 after all the memory contents of the EPROM matrix 56 are loaded to the macro-cell 24 and the word selecting signal R0 is applied thereto again. The flip-flop 115 latches the high level when all the memory contents of the EPROM matrix 56 have been correctly loaded to the macro-cell 24 in the previous loading operation. Therefore the Q-terminal output of the flip-flop 115 is switched to the high level. Hence, the control signal POLCLR is switched to the high level. Then the power-on load circuit 31 is kept inactive. At this time, the Q-terminal output of the flip-flop 111 is supplied to the flip flops 114 and 115 via the OR circuit 112, and thereby the flip-flop 115 is cleared.

On the other hand, when an error occurs in the previous loading operation, the flip-flop 115 latches the low level. Therefore, the states of the flip-flop 111 and the flip-flop 115 are not changed.

Figure 14A:
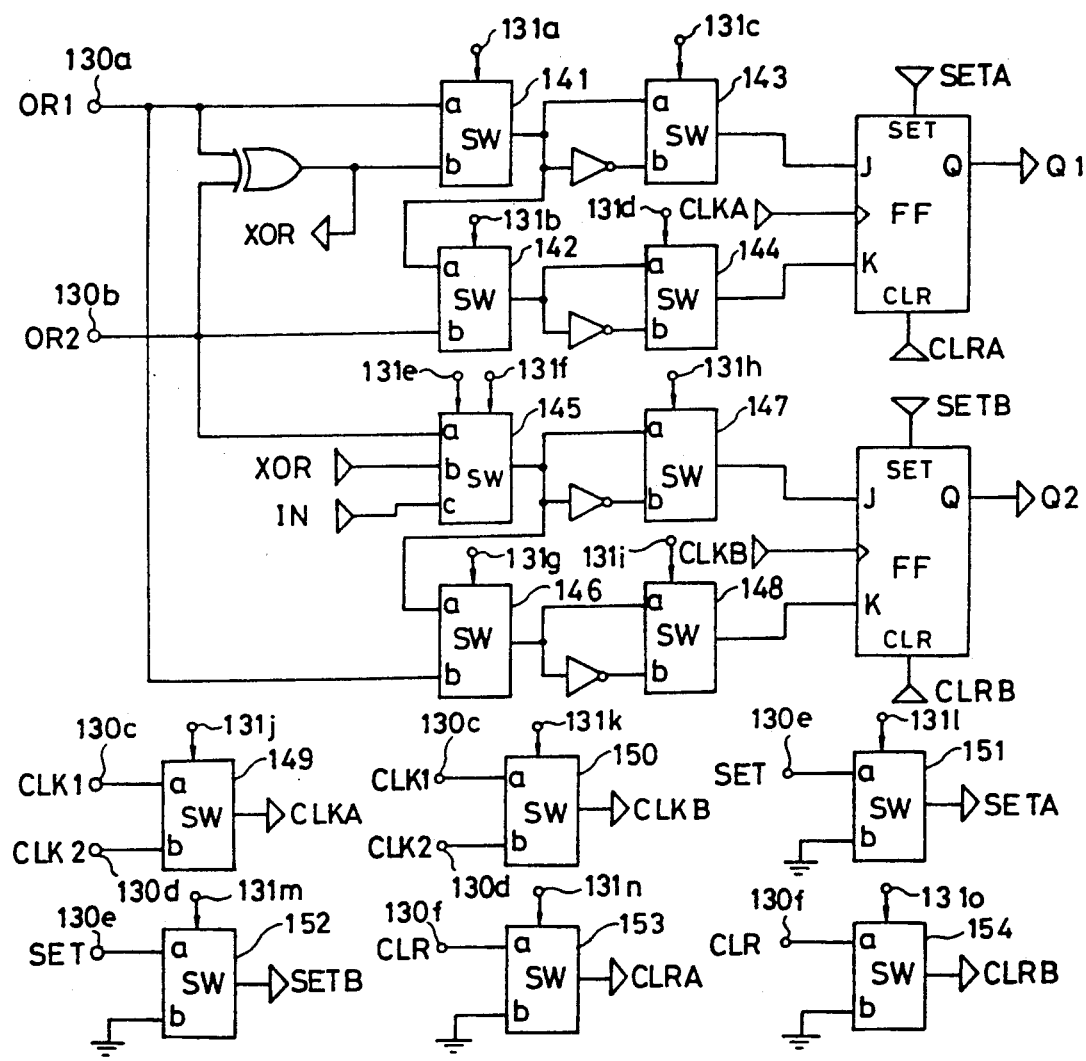
FIG. 14A shows circuits which may be provided in the macro-cell 24 shown in FIG.4.

The macro-cell 24 includes circuits as shown in FIGS. 14A through 14D, for example. Signals OR1 and OR2 which are supplied from the sense amplifier 30 shown in FIG. 4, are applied to terminals 130a and 130b of the macro-cell 24, respectively. Terminals 131a through 131n are supplied with the corresponding control signals (21 bits) which are supplied from the registers 81 to 83 through the terminals 81a, 82a and 83a shown in FIG. 11A. Each of the switches 141 to 144, and 146 to 155 selects a signal applied to a terminal 'a' when the corresponding control signal is kept at the high level. On the other hand, when the control signal is kept at the low level, each of the switches 141 to 144 and 146 to 155 selects a signal applied to a terminal 'b'. Similarly, switches 145, 156 and 157 select one signal out of the signals applied to the terminals 'a', 'b' and 'c', and 'a' to 'd', and 'a' to 'h', respectively, depending on a corresponding 2-bit or 3-bit control signal applied thereto. For example, the switch 145 selects one out of the signals OR2, XOR and IN, depending on the 2-bit control signal applied to the terminals 131e and 131f. In FIG. 14A, set signals such as SETA and SETB, and clear signals such as CLRA and CLRB are supplied from the sense amplifier 30.

Figure 14B:
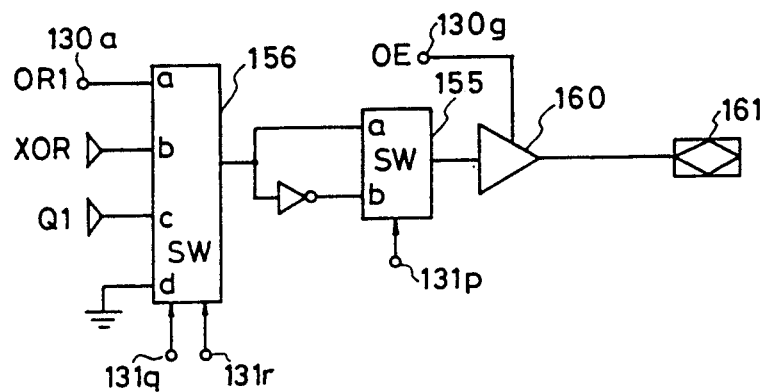
FIG. 14B shows a circuit which may be provided in the macro-cell 24 shown in FIG. 4.

A tri-state buffer 160 shown in FIG. 14B constructs a part of the input/output buffer 23 shown in FIG. 4. When an output enable signal OE supplied from the OR array 29 through the sense amplifier 30, is kept at the low level, the tri-state buffer 160 produces no output signal. On the other hand, when the control signal OE is kept at the high level, the tri-state buffer 160 passes an output of the switch 131p. A terminal 161 connected to the tri-state buffer 160 corresponds to one of the terminals $20_1$ to $20_n$ shown in FIG. 4.

Figure 14C:
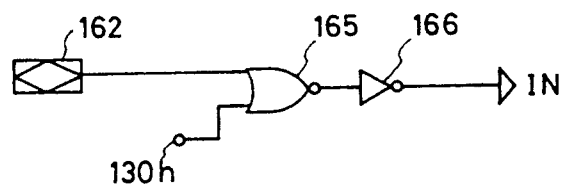
FIG. 14C shows a circuit which may be provided in an input/output buffer 23 shown in FIG. 4.

A circuit shown in FIG. 14C functions as an input buffer portion provided in the input/output buffer 23. The illustrated circuit comprises an OR circuit 165 and an inverter 166. An input signal is supplied to a terminal 10 which is one of the terminals $20_1$ to $20_n$ from the external circuit (not shown).

Figure 14D:
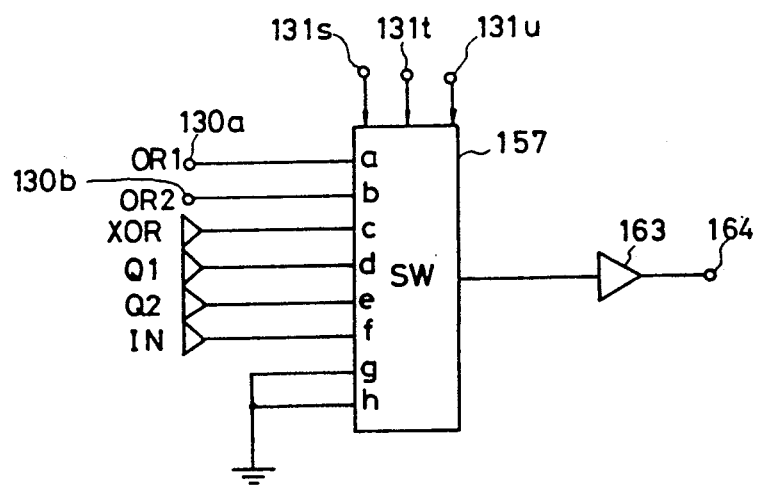
FIG. 14D shows a circuit of a feedback input buffer 25 shown in FIG. 4.

FIG. 14D shows an arrangement of a feedback input buffer portion of the feedback input buffer 25 shown in FIG. 4. The switch 157 receives the signals as shown in FIG. 14D. For example, when the input terminal 'a' is brought into contact with the output terminal in accordance with the control signals applied to the terminals 131s, 131t and 131u, the signal OR1 supplied from the OR array 29 is fed back to the AND array 26. For example, when the input terminal 'f' is selected, the input data IN from the external circuit is supplied to the AND array 26.

Figure 15:
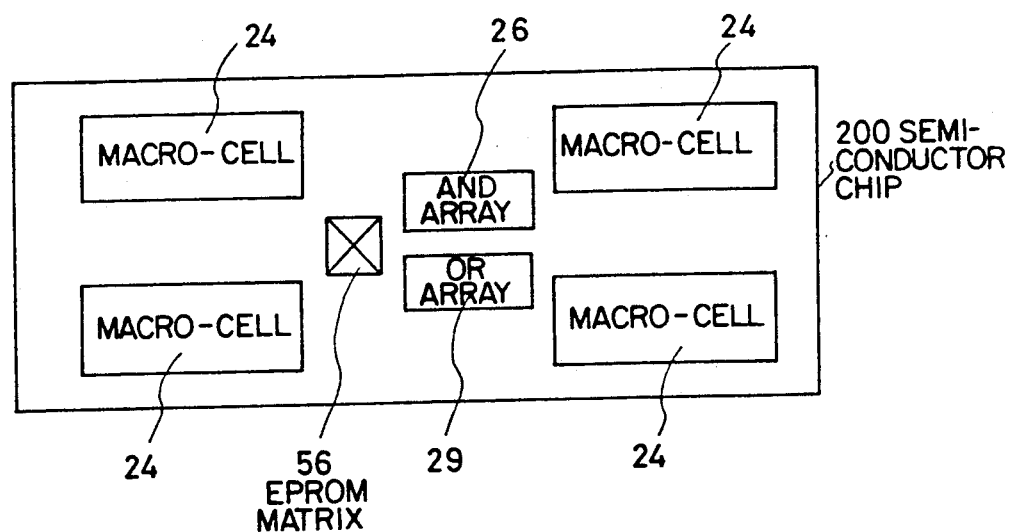
FIG. 15 is a plan view of an example of a semiconductor chip of the programmable logic device according to the present invention.

FIG. 15 is a schematic plan view of an example of a semiconductor chip of the programmable logic device according to the present invention. On a semiconductor chip 200, there are provided a plurality of the macrocells 24, the AND array 26, the OR array 29 and the EPROM matrix 56. According to the present invention, the programmable non-volatile memory elements used for controlling the switches are arranged like a matrix, and therefore they can be formed so as to be grouped in an arbitrary area of the semiconductor chip as shown in FIG. 15. Therefore, the degree of freedom of design of layout of patterns can be facilitated. Further, the write-in and read-out circuit is provided in common to the plurality of non-volatile memory elements for controlling the switches. Therefore, expanded functions can be obtained with ease. For example, a conventional programmable logic device having 24 pins such as EP600 manufactured by Altera, has approximately 100 switches. On the other hand, the present invention makes it possible to provide a programmable logic device of the 24-pin type having 200 to 300 switches or over.

The present invention is not limited to the embodiment specifically disclosed herein, and variations and modifications may be made without departing from the scope of the invention.

What is claimed is:

1. A programmable logic device comprising:
   logic array means for performing a logic operation on a signal supplied thereto;
   external signal input and output terminals;
   a macro-cell connected between said logic array means and said external signal input and output terminals and having a plurality of selectively controllable interconnection circuits and respectively associated register means;
   matrix means comprising a plurality of non-volatile memory elements arranged in a matrix of rows and columns, said plurality of non-volatile memory elements respectively storing memory contents defining specific interconnection circuits to be established by the selectively controllable interconnection circuits of said macro-cell;
   read-out means for reading out the contents of the non-volatile memory elements;
   said register means being coupled to said read-out means for receiving the contents of said non-volatile memory elements, as read out by said read-out means, and for storing the received and read-out contents of the non-volatile memory elements, said selectively controllable interconnection circuits being responsive to the memory contents of the respectively associated register means thereby to establish the corresponding interconnection circuits between the logic array means and the external terminals; and
   verifying means for verifying whether the memory contents stored in the register means coincide with the memory contents which are read out from the non-volatile memory elements and for controlling said read-out means, based on a verified result, so as to selectively read out the contents of said non-volatile memory elements, starting from a predetermined, initial non-volatile memory element selected out of the plurality of non-volatile memory elements.

2. A programmable logic device comprising:
   input/output buffer means for passing an input signal and an output signal from and to, respectively, an external circuit;
   logic array means for performing a logic operation on a signal applied thereto;
   switching means including switches for switching signal lines provided between the logic array means and the input/output buffer means and feedback lines between an input and an output of the logic array means so as to alter the logic operations;
   matrix means including a plurality of non-volatile memory elements arranged in a matrix of rows and columns, said plurality of non-volatile memory elements being respectively associated with the switches, the memory content stored in each of the non-volatile memory elements being used for controlling the switching operation of the respectively associated switch;
   read-out means for reading out the contents of the non-volatile memory elements;
   register means for receiving the contents of the non-volatile memory elements, as read out by the read-out means, and storing the received and read-out contents of the non-volative memory elements in correspondence with the respectively associated switches, the switching operations of the switches being controlled by the contents of the respectively associated non-volatile memory elements, as read out therefrom and stored in the register means; and
   verify means for verifying whether the contents stored in the register means coincide with the contents which are read out from the non-volatile memory elements and for controlling the read-out means, based on a verified result, so as to selectively read out the contents of the non-volatile memory elements, starting from a predetermined, initial non-volatile memory element selected out of the plurality of non-volatile memory elements.

3. A programmable logic device as claimed in claim 2, wherein the read-out means comprises detecting means for detecting power-ON of the device, the read-out means responding to the detection of power-ON by the detecting means, to transfer the contents of the non-volatile memory elements to the register means.

4. A programmable logic device as claimed in claim 2, further comprising write-on means for writing data into the plurality of non-volatile memory elements.

5. A programmable logic device as claimed in claim 2, wherein the non-volatile memory elements comprise electrically programmable read only memory cells.

6. A programmable logic device as claimed in claim 2, wherein the register means comprises a plurality of registers for storing the memory contents of the respectively associated non-volatile memory elements.

7. A programmable logic device as claimed in 6, further comprising means for generating a write enable signal which enables one of the registers in response to a part of an address received by the access control means.

8. A programmable logic device as claimed in claim 2, wherein the read-out means comprises clock generating means for generating a clock signal, address generating means responsive to said clock signal for generating successive addresses selectively and individually identifying the plurality of non-volatile memory elements, access control means for receiving the successive addresses generated by said address generating means and, in response thereto, for selectively enabling read-out of the contents of the non-volatile memory elements respectively identified by the received, successive addresses, and sense amplifier means for amplifying the read-out contents of the non-volatile memory elements and supplying the amplified, read-out contents to the register means.

9. A programmable logic device as claimed in claim 8, wherein the clock generating means generates a first clock signal and a second clock signal which lags behind the first clock signal by 90°, and wherein the address generating means generates the successive addresses in synchronism with the first and second clock signal.

10. A programmable logic device as claimed in claim 8, wherein the matrix means comprises word lines and bit lines defining intersections therebetween and between which, at the intersections thereof, the non-volatile memory elements are respectively connected, and wherein the word lines are coupled to the access control means and the bit lines are coupled to the sense amplifier means.

11. A programmable logic device as claimed in claim 8, wherein the read-out means further comprises multiplexer means for multiplexing the contents read out from the non-volatile memory elements, and an output of said multiplexer means is supplied to the sense amplifier means.

* * * * *

UNITED STATES PATENT AND TRADEMARK OFFICE
CERTIFICATE OF CORRECTION

PATENT NO. : 5,105,388
DATED : April 14, 1992
INVENTOR(S) : Kiyoshi ITANO et al.

It is certified that error appears in the above-identified patent and that said Letters Patent is hereby corrected as shown below:

Col. 1, line 10, after "device" insert --,--;
line 12, after "and" insert --performs--;
line 15, after "to" insert --as a--;
line 42, delete "resistant ability";
line 43, delete "high-voltage".

Col. 2, line 8, after "elements" insert --.--;
line 9, before "to be" delete "a signal";
line 10, after "supplied" insert --,--;
line 21, after "in" insert --,--.

Col. 5, line 1, delete "a";
line 20, delete "of".

Col. 6, line 2, after "R0" insert --is shown--;
line 19, change "20" to --twenty--;
line 31, change "Cl" to --C1--;
line 39, delete "," preceding "Q40";
line 54, change "transitransistor" to --transistor--.

Col. 8, line 27, change "a11" to --all--.

UNITED STATES PATENT AND TRADEMARK OFFICE
CERTIFICATE OF CORRECTION

PATENT NO. : 5,105,388
DATED : April 14, 1992
INVENTOR(S) : Kiyoshi ITANO et al.

It is certified that error appears in the above-identified patent and that said Letters Patent is hereby corrected as shown below:

* Col. 10, line 48, change "non-volative" to --non-volatile--.

Col. 11, line 2, change "write-on" to --write-in--.

Signed and Sealed this

Twenty-eighth Day of December, 1993

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,105,388
DATED : April 14, 1992
INVENTOR(S) : Kiyoshi ITANO et al.

It is certified that error appears in the above-indentified patent and that said Letters Patent is hereby corrected as shown below:

Title page, item [73] Assignee: After "Kawasaki", change "," to --;-- and insert --and Fujitsu VLSI Limited, both of--.

Signed and Sealed this

Fifth Day of April, 1994

Attest:

BRUCE LEHMAN

Attesting Officer

Commissioner of Patents and Trademarks